(12) United States Patent
Korzyniowski et al.

(10) Patent No.: US 6,735,750 B2
(45) Date of Patent: May 11, 2004

(54) SYSTEM AND METHOD FOR CORRECTING CHARGE COLLECTOR VIOLATIONS

(75) Inventors: Ryan Matthew Korzyniowski, Fort Collins, CO (US); Troy Horst Frerichs, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 74 days.

(21) Appl. No.: 10/144,072

(22) Filed: May 13, 2002

(65) Prior Publication Data

US 2003/0212969 A1 Nov. 13, 2003

(51) Int. Cl.[7] .............................................. G06F 17/50
(52) U.S. Cl. .................................. 716/5; 716/1; 716/11
(58) Field of Search ..................................... 716/1, 5, 11

(56) References Cited

U.S. PATENT DOCUMENTS 6,591,402 B1 * 7/2003 Chandra et al. ............... 716/5
6,611,950 B2 * 8/2003 Ishikura ........................ 716/7
2002/0066067 A1 * 5/2002 Wang et al. .................. 716/11

* cited by examiner

*Primary Examiner*—Vuthe Siek
*Assistant Examiner*—Thuan Do

(57) ABSTRACT

An electrical rules checker system and method provides for correcting charge collector violations in a netlist. In accordance with one aspect of the invention, the electrical rules checker system includes a charge collector violation correction mechanism that includes a logic for analyzing the circuit configuration in a netlist, and a logic for identifying a charge collector violation in the circuit configuration. The charge collector violation correction mechanism further includes a logic for adding a charge collector diode to the netlist to correct the charge collector violation in the circuit configuration. In accordance with another aspect of the invention, a method analyzes the circuit configuration in a netlist, and identifies a charge collector violation in the circuit configuration. A charge collector diode is then added to the netlist to correct the charge collector violation in the circuit configuration.

20 Claims, 7 Drawing Sheets

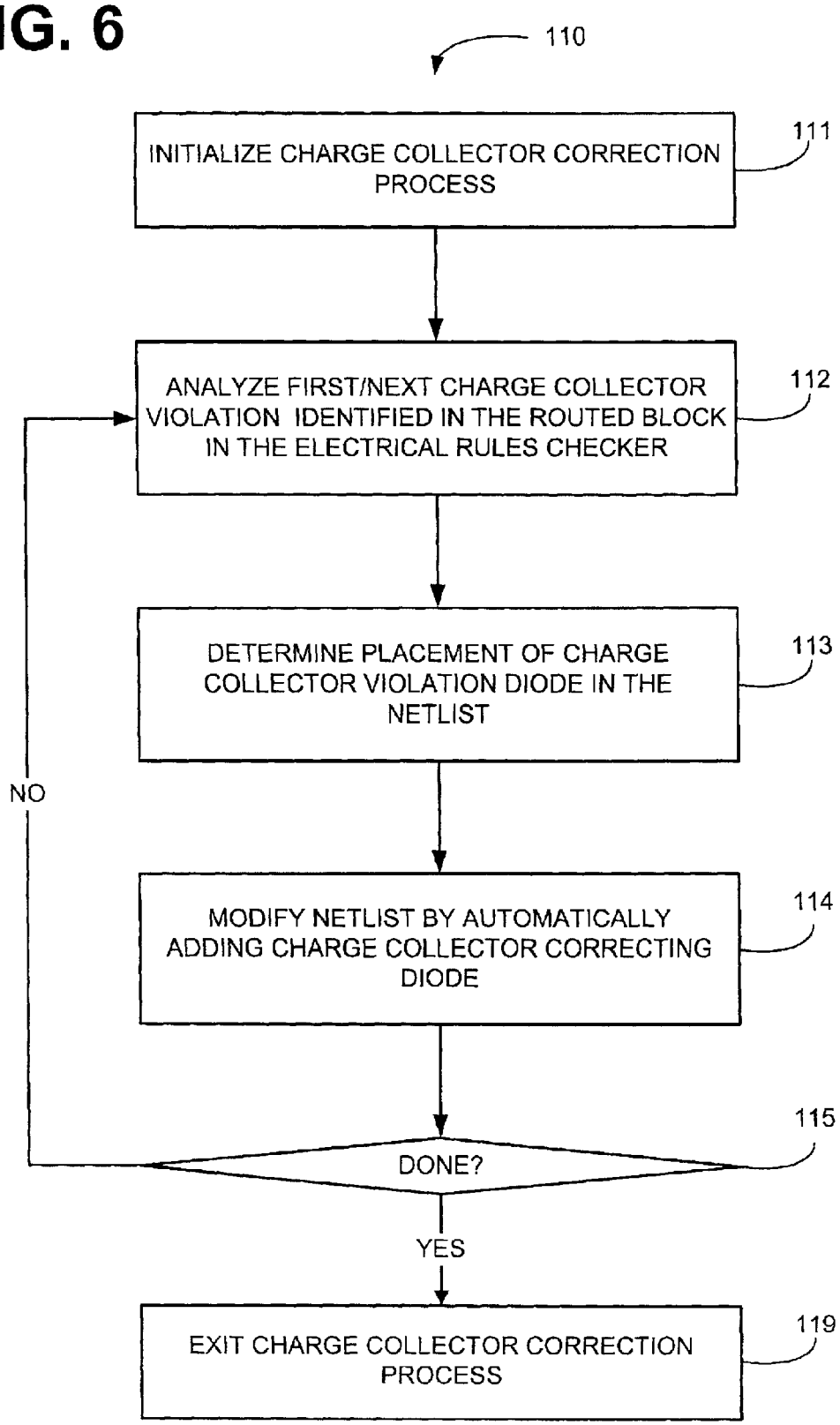

SYSTEM AND METHOD FOR CORRECTING CHARGE COLLECTOR VIOLATIONS

BACKGROUND OF THE INVENTION

1. Field of the Invention

The present invention generally relates to computer-aided circuit design systems, and more particularly, to an electrical rules checker system and method for identifying and correcting charge collector violations in datapath macros.

2. Discussion of the Related Art

Integrated circuits (ICs) are electrical circuits comprised of transistors, resistors, capacitors, and other components on a single semiconductor "chip" in which the components are interconnected to perform a variety of functions. Typical examples of ICs include, for example, microprocessors, programmable logic devices (PLDs), electrically erasable programmable read only memory devices (EEPROMs), random access memory devices (RAMs), operational amplifiers and voltage regulators. A circuit designer typically designs the IC by creating a circuit schematic indicating the electrical components and their interconnections. Often, designs are simulated by computer to verify functionality and to ensure that performance goals are satisfied.

In the world of electrical device engineering, the design and analysis work involved in producing electronic devices is often performed using electronic computer-aided design (E-CAD) tools. As will be appreciated, electronic devices include analog, digital, mixed hardware, optical, electromechanical, and a variety of other electrical devices. The design and subsequent simulation of any circuit, very large scale integration chip, or other electrical device via E-CAD tools allows a circuit to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device that includes the circuit. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the schematic of the circuit device.

In contrast, a hierarchical netlist will only maintain one copy of a circuit module, which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component where the inputs, outputs, and general function are known, but the contents of which are not shown. These "black box" representations, hereinafter called "modules," will mask the complexities therein, typically showing only input/output ports.

An IC design can be represented at different levels of abstraction, such as at the register-transfer level (RTL) and the at logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip flops.

Set forth above is some very basic information regarding integrated circuits and other circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally, such systems operate by identifying certain critical timing paths, then evaluating the circuit to determine whether timing violations may occur through the critical paths. As is known, timing specifications may be provided to such systems by way of a configuration file.

FIG. 1A is a block diagram illustrating a prior art static timing analyzer system that illustrates the basic informational flow in such a system and that is generally denoted by reference numeral 2. Specifically, one such system 2 is marketed under the name PathMill®. FIG. 1 illustrates the informational flow in system 2. At the center of the diagram is a static timing analyzer 10, (i.e., the PathMill® program). Surrounding this block 10 are a number of other blocks that represent various input and output files and/or information.

More particularly, the static timing analyzer 10 may utilize a configuration file 12, a file of timing models 14, one or more netlist files 16, a technology file 18, and a parasitics file 20, for various input information. In addition, the static timing analyzer 10 may generate a number of different output files or other output information, including a critical path report 22, a runtime log file 24, an error report 26, a software interface file 28, and a SPICE netlist 30. When started, the static timing analyzer 10 first processes the input netlist file(s) 16, the technology file 18, and the configuration files 12. The information from these files is subsequently used for performing path analyses. The function and operation of static timing analyzer 10 are generally well known, and therefore will not be discussed in detail herein.

While tools such as these are useful for the design verification process after layout, there are various shortcomings in the static timing analyzer 10, and other similar products. These shortcomings include, but are not limited to, the ability to identify and correct charge collector violations.

Charge collector violations occur when the metal-to-transistor gate ratio exceeds a set limit. A metal line that is not connected to a diode can accumulate static charge during manufacturing. The amount of charge can be determined by the size of the metal line. If this charge becomes too large and cannot be properly dissipated, the connected transistor gate can be damaged or destroyed.

One prior solution to charge collector violations in datapath macros was to run an antenna charge collector-correcting program, known as "antfix." However, datapath macros are normally built very compactly, and therefore the antenna charge collector correcting program was not able to correct many of the charge collection violations since it lacks the room to place the diodes. This can be seen in FIG. 1B, with datapath macros 32 and 34, being situated too close to the memory array 33 to place the diodes.

Remaining errors could be corrected by manually placing and connecting diodes on the artwork to the affected signals. However, this was extremely imprecise and labor intensive and thus, few charge collector violations were corrected. Consequently, there is a heretofore unaddressed need in the industry for a way to address the aforementioned deficiencies and inadequacy.

SUMMARY OF THE INVENTION

The present invention provides an electrical rules checker system and method for identifying and correcting charge collector violations in datapath macros.

Briefly described, in architecture, the electrical rules checker can be implemented as follows. The electrical rules checker includes a charge collector correcting mechanism that provides for correcting charge collector violations in a circuit configuration. The charge collector correcting mechanism includes logic for analyzing the circuit configuration in a netlist, and a logic for identifying a charge collector violation in the circuit configuration. The charge collector correcting mechanism further includes logic for adding a charge collector diode to the netlist to correct the charge collector violation in the circuit configuration The invention can also be viewed as providing one or more methods for identifying and correcting charge collector violations in datapath macros. In this regard, one such method can be summarized by the following steps: (1) analyze the circuit configuration in a netlist; (2) identify a charge collector violation in the circuit configuration; and (3) add a charge collector diode to the netlist to correct the charge collector violation in the circuit configuration.

DESCRIPTION OF THE DRAWINGS

The accompanying drawings incorporated in and forming a part of the specification, illustrate several aspects of the present invention, and together with the description serve to explain the principles of the invention. In the drawings:

FIG. 6 is a flowchart illustrating one possible implementation of the method for performing the charge collector correcting process as shown in FIGS. 3 and 4, that determines a placement of charge collector correcting diodes and automatically places the charge collector correcting diodes in the netlist.

DETAILED DESCRIPTION OF THE PREFERRED EMBODIMENT

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

Currently, datapath macros are built very compactly in the artwork, and thus, lack room to place additional circuitry between the datapath macros. A datapath macro is a logical representation of logic and physical characteristics of a circuit element. Typically, charge collector violations have been corrected by manually placing and connecting diodes in the artwork to affect the datapath signals. Because of the ever increasing complexity and density of these datapath macros, fewer and fewer charge collector violations were being corrected. With the new charge collector violation correction methodology of the present invention, more charge collector violations can be quickly corrected, and thereby reduce the amount of manual intervention and potential human error.

The charge collector violation correction methodology of the present invention, identifies those datapath macros needing charge collector correcting diodes, and can spread the datapath macros apart to make room for the charge collector correcting diodes if space is needed. Since it is possible to identify the charge collector violations, the charge collector violation correction methodology used by the present invention is thus able to identify those datapath macros needing diodes and automatically update the netlist to include the charge collector correcting diodes and perform the connectivity changes. Consequently, the datapath macro is rerouted and the charge collector violation is corrected.

Figure 2:
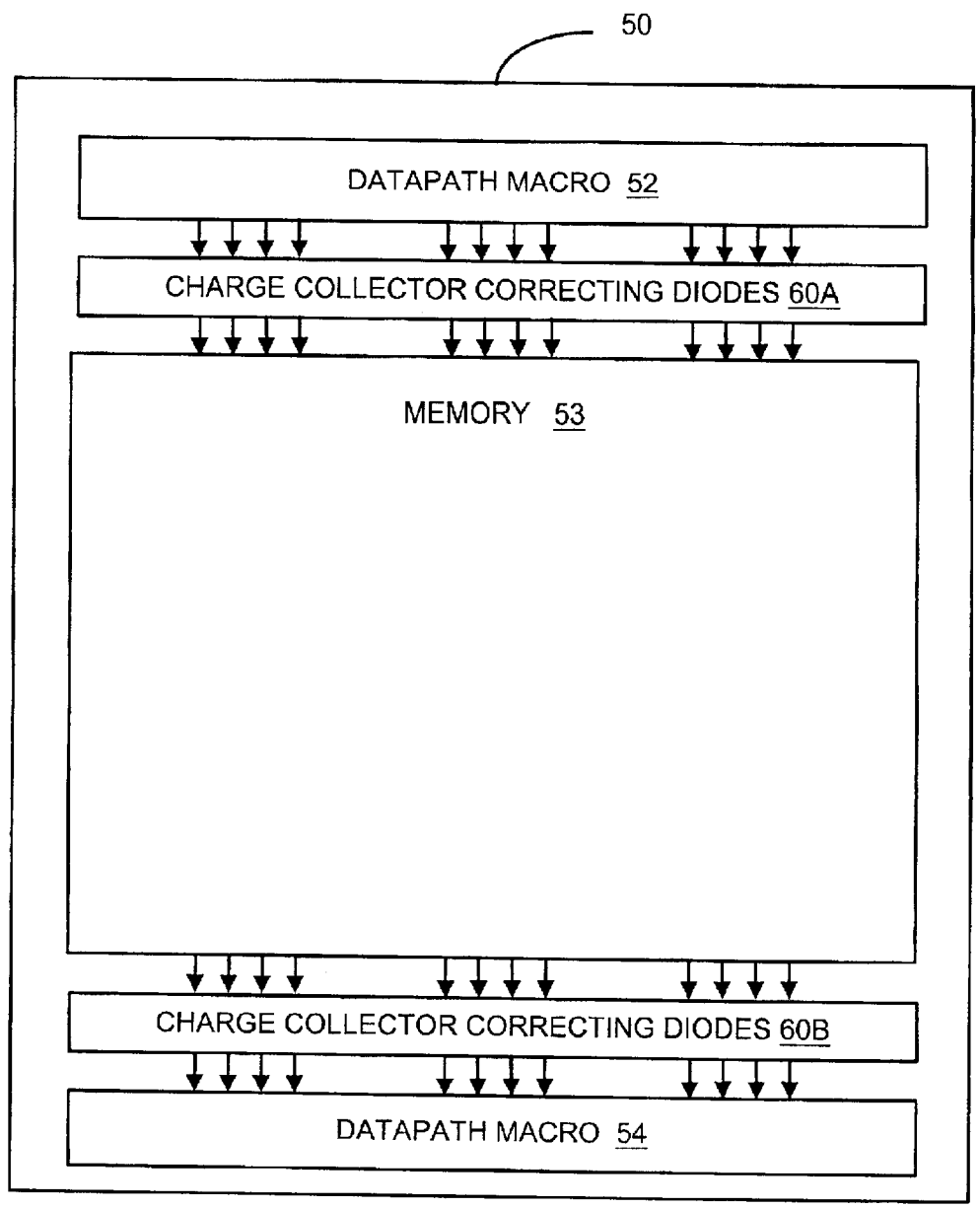
FIG. 2 is a block diagram illustrating one possible implementation of the placement of the charge collector correcting diodes using the charge collector violation correction methodology of the present invention.

FIG. 2 is a block diagram illustrating one possible implementation of the placement of the charge collector correcting diodes using the charge collector violation correction methodology of the present invention. Charge collector correcting diodes 60 are placed between the datapath macros 52 and 54, and memory 53 as provided by the identification and placement of the charge collector correcting diodes 60. As shown, the logic block 50 includes the datapath macros 52 and 54 and memory 53 interspersed by the charge collector correcting diodes 60. If needed, the spreading apart of the datapath macros 52 and 54 away from memory 53 to make room for the charge collector correcting diodes can be done by modifying the netlist 16. In a configuration file 12, the placement of charge collector correcting diodes 60, as well as the spreading activity, are specified. Datapath macros with charge collector violations that were identified can then be modified as shown. The charge collector correcting diodes 60A and 60B are automatically placed in the netlist and automatically updated to reflect the connectivity changes in the block 50 that is rerouted, thereby correcting the charge collector violations.

Figure 3:
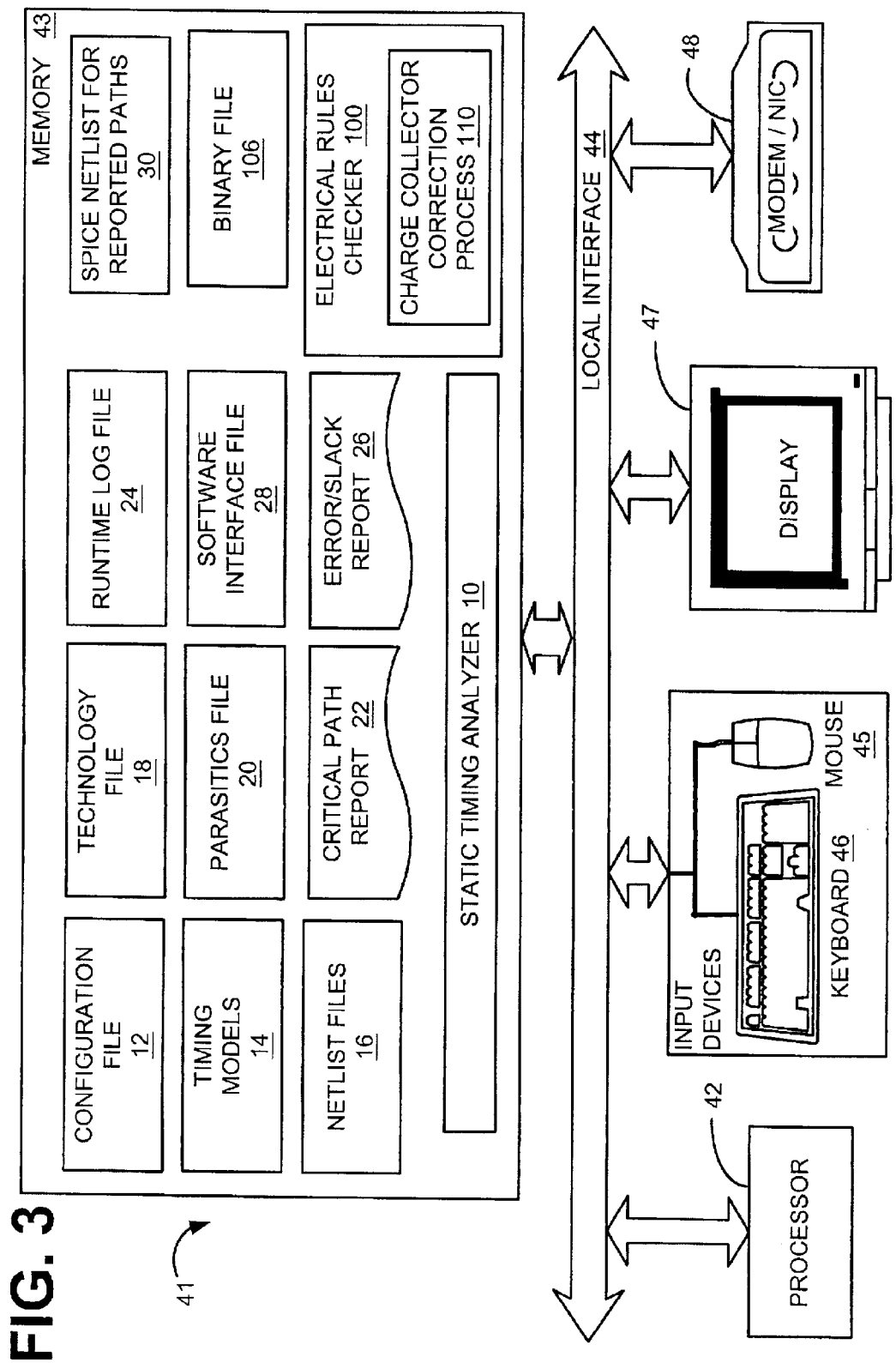
FIG. 3 is a block diagram illustrating one possible implementation of an electrical rules checker that utilizes a charge collector correcting process, situated within a computer readable medium, for example, such as in a computer system.

FIG. 3 is a block diagram illustrating one possible implementation of an electrical rules checker 100 that utilizes the charge collector violation correction process 110 of the present invention, situated within a computer readable medium, such as, for example, a memory 43 in a general-purpose computer system 41. A general-purpose computer system can identify, access, and process resources desired by a user.

Generally, in terms of hardware architecture, as shown in FIG. 3, the computer system 41 includes a processor 42, memory 43, and one or more input devices and/or output (I/O) devices (or peripherals) that are communicatively coupled via a local interface 44. The local interface 44 can be, for example but not limited to, one or more buses or other wired or wireless connections, as is known in the art. The local interface 44 may have additional elements, which are omitted for simplicity, such as controllers, buffers (caches), drivers, repeaters, and receivers, to enable communications. Further, the local interface 44 may include address, control, and/or data connections to enable appropriate communications among the aforementioned components.

The processor 42 is a hardware device for executing software that can be stored in memory 43. The processor 42 can be any custom made or commercially available processor, a central processing unit (CPU) or an auxiliary processor among several processors associated with the computer system 41, and a semiconductor based microprocessor (in the form of a microchip) or a macroprocessor. Examples of suitable commercially available microprocessors are as follows: an 80x86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 43 can include any one or combination of volatile memory elements (e.g., random access memory (RAM, such as DRAM, SRAM, etc.)) and nonvolatile memory elements (e.g., ROM, hard drive, tape, PROM, CDROM, etc.). Moreover, the memory 43 may incorporate electronic, magnetic, optical, and/or other types of storage media. Note that the memory 43 can have a distributed architecture, where various components are situated remote from one another, but can be accessed by the processor 42.

The software in memory 43 may include one or more separate programs, each of which comprises an ordered listing of executable instructions for implementing logical functions. In the example of FIG. 3, the software in the memory 43 includes an operating system (not shown), configuration file 12, file of timing models 14, one or more netlist files 16, technology file 18, and a parasitics file 20, containing various input information. The critical path report 22, runtime log file 24, error report 26, software interface file 28, SPICE (i.e., a circuit simulator) netlist 30, and binary file 106 output files or other output information are also situated in memory 43. The charge collector correction process 110 used to identify and correct charge collector violations is herein defined in further detail with regard to FIGS. 4–6.

A non-exhaustive list of examples of suitable commercially available operating systems (O/S) is as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system essentially controls the execution of other computer programs, such as the checksum code operation mechanism, and provides scheduling, input-output control, file and data management, memory management, and communication control and related services.

The electrical rules checker 100 that utilizes charge collector correction process 110 may be a source program, executable program (object code), script, or any other entity comprising a set of instructions to be performed. When a source program, the program is usually translated via a compiler, assembler, interpreter, or the like, which may or may not be included within the memory 43, so as to operate properly in connection with the O/S. Furthermore, the electrical rules checker 100 that utilizes the charge collector correction process 110 can be written as (a) an object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices may include input devices, for example but not limited to, a keyboard 46, mouse 45, scanner, microphone, etc. Furthermore, the I/O devices may also include output devices, for example but not limited to, a printer, display 47, etc. Finally, the I/O devices may further include devices that communicate both inputs and outputs, for instance but not limited to, a modulator/demodulator (modem; for accessing another device, system, or network) 48, a radio frequency (RF) or other transceiver, a telephonic interface, a bridge, a router, etc.

If the computer system 41 is a PC, workstation, or the like, the software in the memory 43 may further include a basic input output system (BIOS) (omitted for simplicity). The BIOS is a set of essential software routines that initialize and test hardware at startup, start-up the O/S, and support the transfer of data among the hardware devices. The BIOS is stored in ROM so that the BIOS can be executed when the computer system 41 is activated.

When the computer system 41 is in operation, the processor 42 is configured to execute software stored within the memory 43, to communicate data to and from the memory 43, and to generally control operations of the computer system 41 pursuant to the software. The electrical rules checker 100 that utilizes the charge collector correction process 110 and the O/S are read, in whole or in part, by the processor 42, perhaps buffered within the processor 42, and then executed.

The electrical rules checker 100 can be implemented in hardware, software, firmware or a combination thereof. In the preferred embodiment, the electrical rules checker 100 and the charge collector correction process 110 are implemented in software or firmware that is stored in a memory, such as the memory 43, and that is executed by a suitable instruction execution system, such as processor 42.

Figure 4:
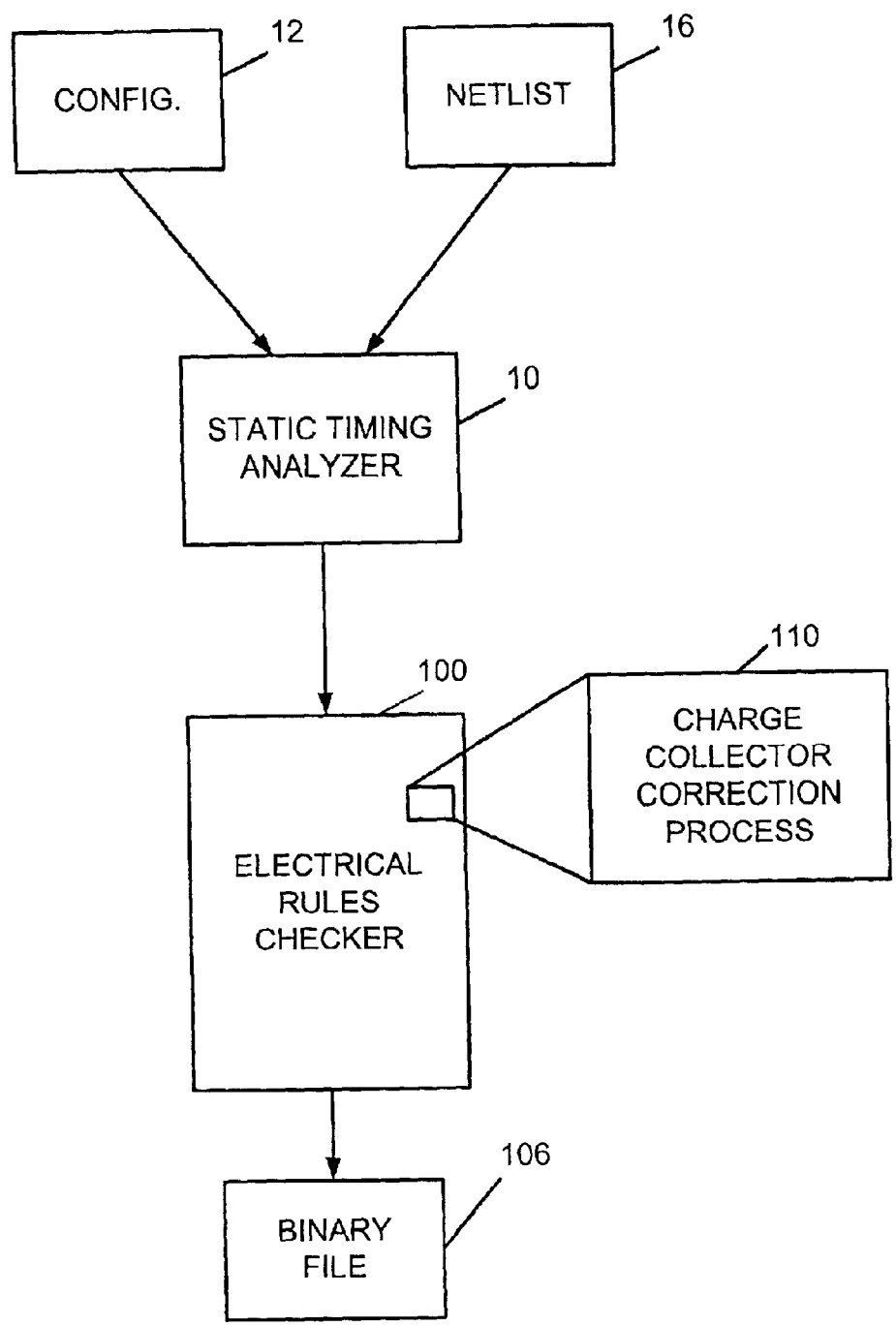
FIG. 4 is a block diagram illustrating one possible implementation of an electrical rules checker and the charge collector correcting process of the present invention, as shown in FIG. 3.
Figure 5:
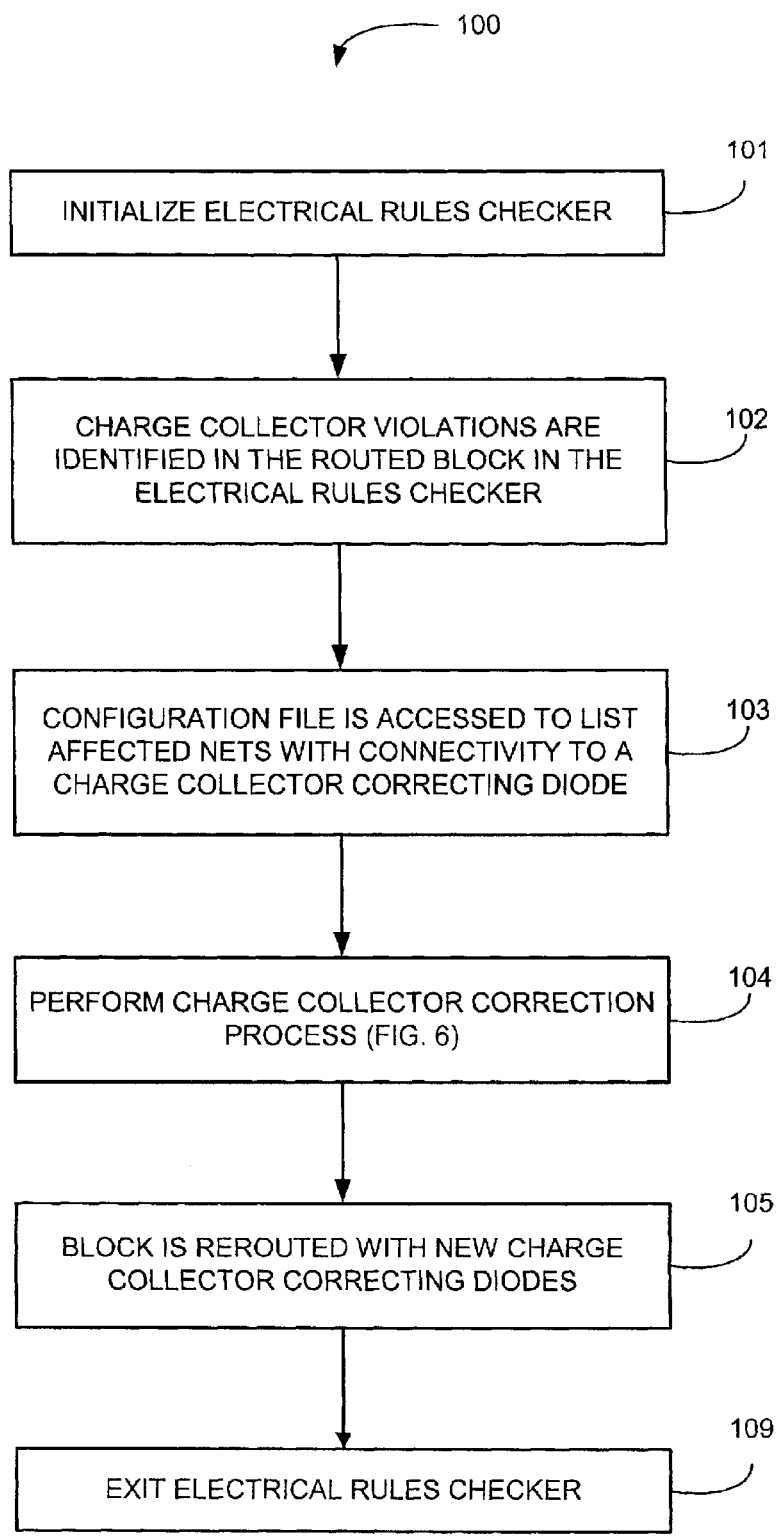
FIG. 5 is a flowchart illustrating one possible implementation of the electrical rules checker shown in FIGS. 3 and 4.

Having set forth the basic and probable circuit configurations of the various structures identified by the system and method of the present invention, reference is now made to FIGS. 4–6, which collectively comprise a block diagram and flow charts that illustrates the top-level functional operation of the electrical rules checker 100 and the charge collector correction process 110 in accordance with the preferred embodiment of the present invention.

Figure 1A:
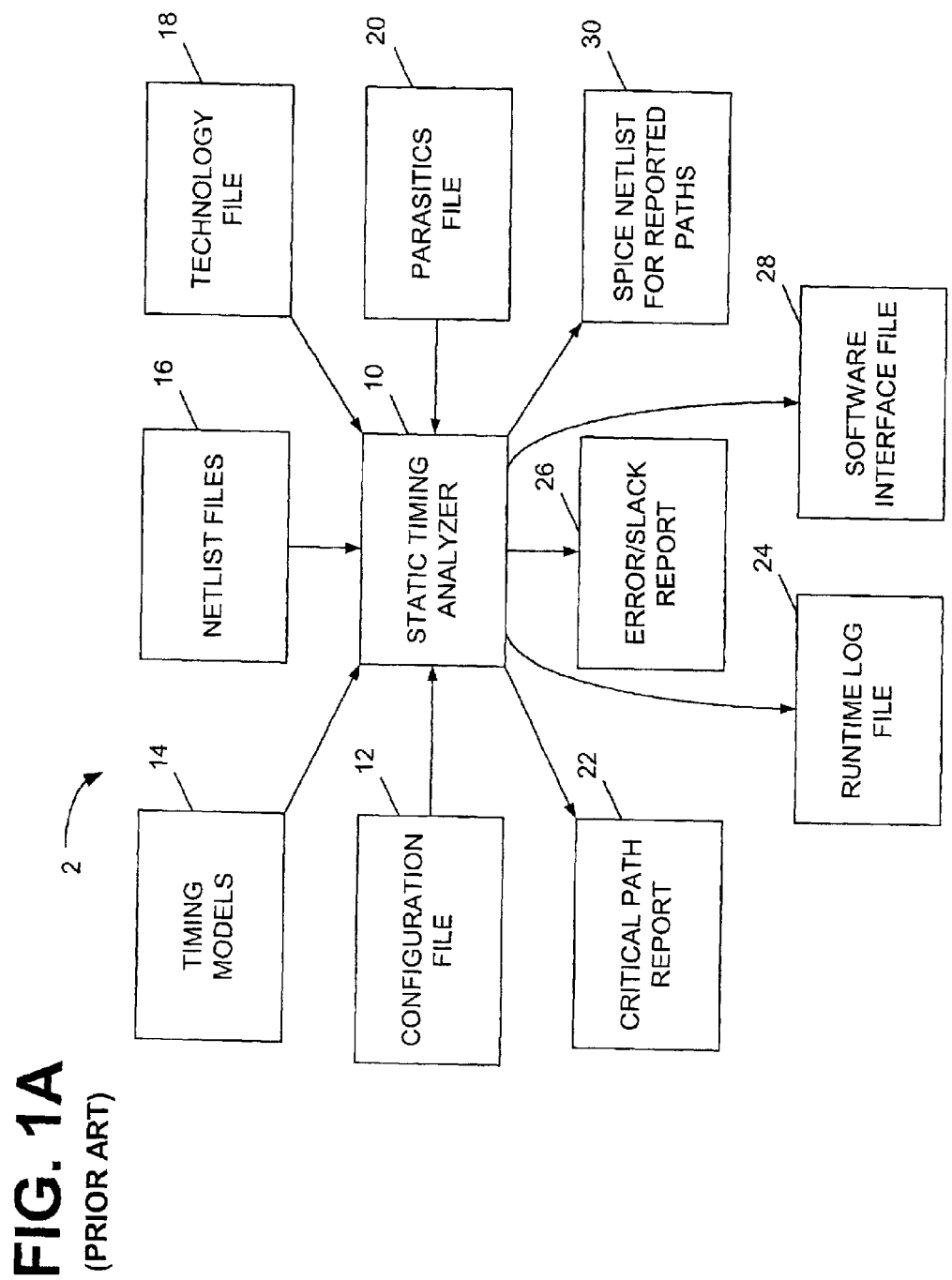
FIG. 1A is a block diagram of a static timing analyzer system, as is known in the prior art.
Figure 1B:
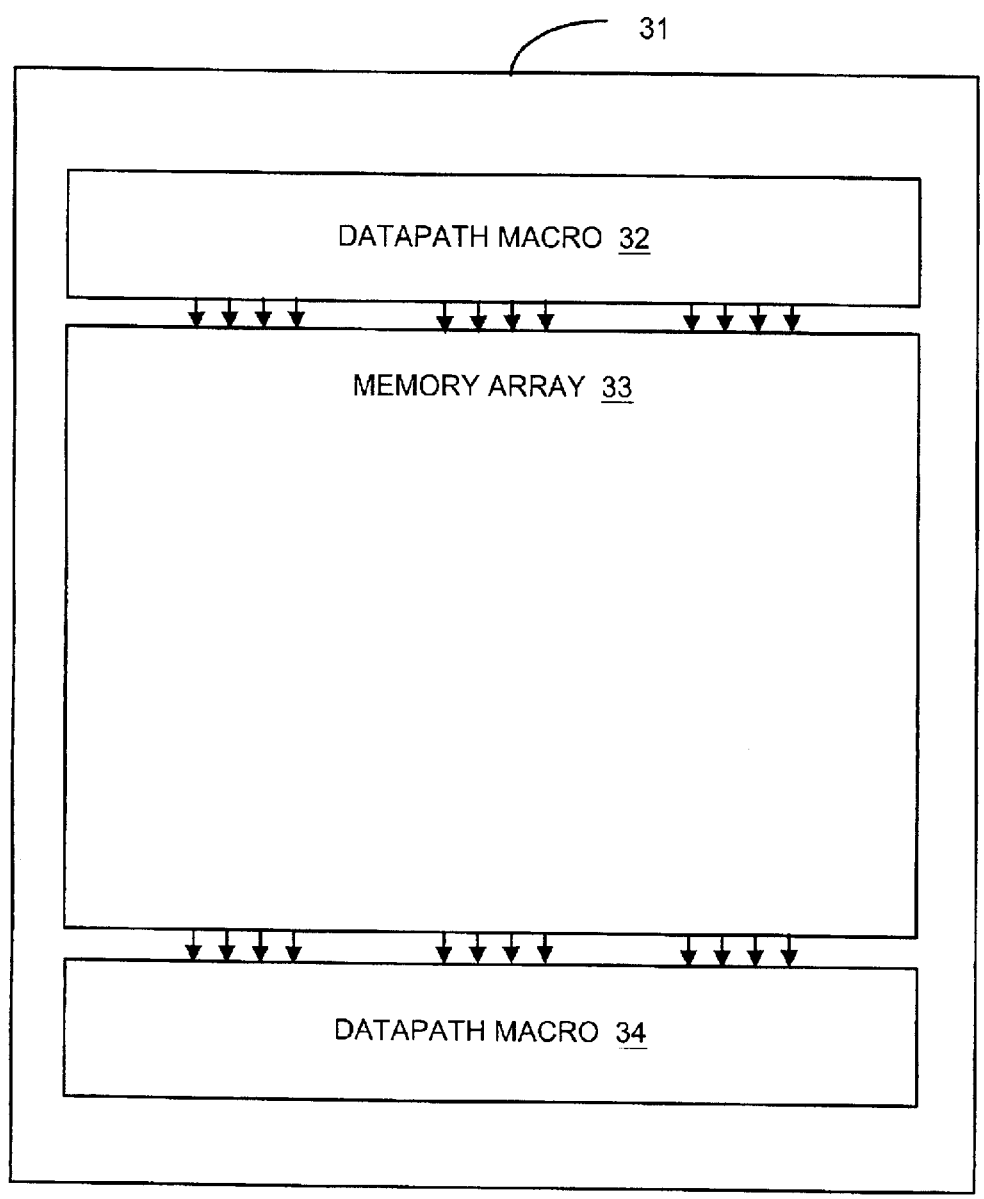
FIG. 1B is a block diagram of the connection between datapath macros as known in the prior art.

FIG. 4 is a block diagram illustrating one possible implementation of an electrical rules checker 100 and the charge collector correction process 110 of the present invention, as shown in FIG. 3. In the illustrated embodiment, only the static timing analyzer 10, the configuration file 12 and the netlist file 16 from FIG. 1A are shown. The configuration file(s) 12 contains information that informs the static timing analyzer 10 how to perform its analysis, and various configuration files may be used. The netlist file 16, as is well known, defines the various integrated circuit components, their inter-relations and connectivity. The static timing analyzer 10 may make available to the electrical rules checker 100 a binary file output 106.

The electrical rules checker 100 preferably is configured to operate on an output of the static timing analyzer 10. In this regard, the static timing analyzer may be configured to generate other output netlist files 16, which the electrical rules checker 100 utilizes as an input. As previously mentioned, there are a wide variety of reasons why an electrical rules checker 100 may be desired. One such reason to utilize an electrical rules checker 100 is to perform various checks over certain rules or strategies in an integrated circuit design. Such rules may vary from circuit to circuit, depending upon the particular application.

The electrical rules checker 100 includes the preferred embodiment of the present invention, and operates to provide a method for identifying and correcting charge collector violations in datapath macros. Normally, datapath macros are very compactly constructed in the artwork. Therefore, many charge collector violations were not able to be corrected conveniently because of the lack of space to place the diodes that correct these violations. This lack of space requires that the chip designer manually place and connect diodes in the artwork to correct the affected signals. By utilizing the charge collector correction technique of the present invention, more charge collector violations can be quickly and easily identified and corrected, thereby reducing the amount of manual intervention required. The reduction of manual intervention and the automatic generation of the charge collector correcting diode 60 makes the design less error prone.

In an alternative embodiment, the method for identifying and correcting charge collector violations in datapath macros can be performed prior to running the static timing analyzer 10. Running the static timing analyzer 10 after identifying and correcting charge collector violations in datapath macros is performed in order to validate that the charge collector correcting diodes 60 meet the design specifications, as well as to test any circuitry that may have been added.

FIG. 5 is a flowchart illustrating one possible implementation of the electrical rules checker 100 with the charge collector correction process 110 of the present invention. The electrical rules checker 100 is performed in order to verify that the current design meets charge collector specifications.

First, the electrical rules checker 100 initializes at step 101. At step 102, the charge collector violations are identified in each routed block in the netlist 16. Next, the configuration file 12 is accessed to list the affected nets with connectivity to a charge collector violation, at step 103. At step 104, the electrical rules checker 100 then performs the charge collector correcting process, herein described in further detail with regard to FIG. 6. At step 105, the blocks with new charge collector correcting diodes 60 are rerouted. This rerouting is performed because some of the blocks may have moved with the insertion of the charge collector correcting diodes 60. The electrical rules checker 100 then exits the step 109.

FIG. 6 is a flowchart illustrating one possible implementation of the charge collector correction process 110 utilized within the electrical rules checker 100. With the charge collector correcting methodology provided within the charge collector correction process 110, more violations can be quickly corrected than in the prior art, thereby reducing the amount of manual intervention and thus, human error. The charge collector correction process 110 of the present invention provides the ability to automatically place and connect charge collector correcting diodes 60 to the artwork. There is also a netlist update functionality to reroute datapath macros.

First, the charge collector correction process 110 initializes at step 111. At step 112, the charge collector correction process 110 analyzes the first charge collector violation identified in the routing block by electrical rules checker 100. At step 113, the location of a charge collector correcting diode 60 in the netlist is determined.

Next, the charge collector correction process 110 modifies the netlist automatically by adding the charge collector correcting diode 60 at the place determined at step 113. At step 115, the charge collector correction process 110 determines if there are more charge collector violations to be analyzed. If it is determined in step 115 that there are more charge collector violations to be analyzed, then the charge collector correction process 110 returns to repeat steps 112–115. However, if it is determined in step 115 that there are no more charge collector violations to be analyzed, then the charge collector correction process 110 exits at step 119.

Having described the method of the present invention, it will be appreciated that the steps illustrated in the flow charts of FIGS. 5 and 6 are provided for purposes of illustration and are not deemed to be limiting on the broader aspects of the present invention. Indeed, the broader aspects of the present invention may be implemented using a variety of different approaches that are still consistent with the scope and content of the present invention.

It should be appreciated that the flow charts of FIGS. 5 and 6 show the top-level operation of one possible implementation of the methods of the present invention. In this regard, when implemented in software or firmware, as in the case of the preferred embodiment, each block represents a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for correcting charge collector violations in a circuit configuration comprising the steps of:

analyzing the circuit configuration in a netlist;

identifying a charge collector violation in the circuit configuration in the netlist;

making room for a charge collector diode in the circuit configuration in the netlist; and adding said charge collector diode to the circuit configuration in the netlist to correct the charge collector violation in the circuit configuration.

2. The method as defined in claim 1, wherein the circuit configuration comprises a datapath block.

3. The method as defined in claim 1, further comprising:

determining placement of the charge collector diode in the circuit configuration to correct the charge collector violation.

4. The method as defined in claim 1, further comprising:

determining any affected nets with connectivity to the charge collector diode.

5. The method as defined in claim 4, further comprising:

rerouting the circuit configuration to include the charge collector diode.

6. A system for correcting charge collector violations in a circuit configuration, comprising:

means for analyzing the circuit configuration in a netlist;

means for identifying a charge collector violation in the circuit configuration in the netlist;

means for making room for a charge collector diode in the circuit configuration in the netlist; and means for adding said charge collector diode to the circuit configuration in the netlist to correct the charge collector violation in the circuit configuration.

7. The system of claim 6, wherein the circuit configuration comprises a datapath block.

8. The system of claim 6, further comprising:

means for determining placement of the charge collector diode in the circuit configuration to correct the charge collector violation.

9. The system of claim 6, further comprising:

means for determining any affected nets with connectivity to the charge collector diode.

10. The system of claim 8, further comprising:

means for rerouting the circuit configuration to include the charge collector diode.

11. A computer readable storage medium containing program code for correcting charge collector violations in a circuit configuration, comprising:

a first code segment configured to analyze the circuit configuration in a netlist;

a second code segment configured to identify a charge collector violation in the circuit configuration in the netlist;

a third code segment configured to make room for a charge collector diode in the circuit configuration in the netlist; and a fourth code segment configured to add said charge collector diode to the circuit configuration in the netlist to correct the charge collector violation in the circuit configuration.

12. The program code of claim 11, wherein the circuit configuration comprises a datapath block.

13. The program code of claim 11, wherein said fourth code segment is further configured to determine placement of the charge collector diode in the circuit configuration to correct the charge collector violation.

14. The program code of claim 11, wherein said fourth code segment is further configured to determine any affected nets with connectivity to the charge collector diode.

15. The program code of claim 14, wherein said fourth code segment is further configured to reroute the circuit configuration to include the charge collector diode.

16. A charge collector correction mechanism for correcting charge collector violations in a circuit configuration, comprising:

logic for analyzing the circuit configuration in a netlist;

logic for identifying a charge collector violation in the circuit configuration in the netlist;

logic for making room for a charge collector diode in the circuit configuration in the netlist; and logic for adding said charge collector diode to the circuit configuration in the netlist to correct the charge collector violation in the circuit configuration.

17. The charge collector correct mechanism of claim 16, wherein the circuit configuration comprises a datapath block.

18. The charge collector correct mechanism of claim 16, further comprising:

logic for determining placement of the charge collector diode in the circuit configuration to correct the charge collector violation.

19. The charge collector correct mechanism of claim 16, further comprising:

logic for determining any affected nets with connectivity to the charge collector diode.

20. The charge collector correct mechanism of claim 19, further comprising:

logic for rerouting the circuit configuration to include the charge collector diode.

* * * * *